United States Patent [19]

Honda et al.

[11] Patent Number: 4,802,118

[45] Date of Patent: Jan. 31, 1989

[54] COMPUTER MEMORY REFRESH CIRCUIT

[75] Inventors: Toyota Honda; Shigeru Hirahata, both of Yokohama, Japan

[73] Assignee: Hitachi, Ltd., Tokyo, Japan

[21] Appl. No.: 674,774

[22] Filed: Nov. 26, 1984

[30] Foreign Application Priority Data

Nov. 25, 1983 [JP] Japan .................. 57-220631

[51] Int. Cl.⁴ .................. G09G 1/00; G09G 1/04
[52] U.S. Cl. .................. 364/900; 340/750; 340/799; 365/222
[58] Field of Search .......... 340/750, 799, 798; 365/222; 364/200 MS File, 900 MS File

[56] References Cited

U.S. PATENT DOCUMENTS

| | | | |
|---|---|---|---|
| 4,070,710 | 1/1978 | Sukonick et al. | 364/900 |
| 4,158,883 | 6/1979 | Kandono et al. | 364/200 |
| 4,468,662 | 8/1984 | Tanaka | 340/789 |
| 4,511,892 | 4/1985 | Grothe | 340/739 |
| 4,511,965 | 4/1985 | Rajaram | 364/200 |
| 4,556,879 | 12/1985 | Tanaka | 340/750 |
| 4,587,559 | 5/1986 | Longacre, Jr. et al. | 358/160 |
| 4,595,996 | 6/1986 | Morley et al. | 364/900 |
| 4,661,812 | 4/1987 | Ikeda | 340/799 |
| 4,665,495 | 5/1987 | Thaden | 364/518 |

OTHER PUBLICATIONS

Zaks, Rodney; "Microprocessors from Chips to Systems," pp. 55–56, SYBEX, 1980.

Primary Examiner—Thomas M. Heckler
Assistant Examiner—Jonathan C. Fairbanks
Attorney, Agent, or Firm—Antonelli, Terry & Wands

[57] ABSTRACT

This invention is so arranged that, in a dynamic random access memory including a display memory area storing therein the display data and a system memory area employed for arithmetic operation in a central processing unit, memory refresh is accomplished by a display address signal applied to the dynamic random access memory when information stored in the dynamic random access memory is utilized for display, and a refresh address signal from a refresh counter for generating such a refresh address signal is applied to the random access memory as a burst signal for a predetermined period at predetermined intervals during a display frame time, thus refreshing memory, when information stored in the dynamic random access memory is not utilized for display.

9 Claims, 8 Drawing Sheets

| ADDRESS | MEMORY USED FOR |
|---------|-----------------|
| 0 0 0 0 0 5 0 0 | WORK MEMORY AREA |
| 0 5 0 1 4 3 F F | DISPLAY MEMORY AREA |
| 4 4 0 1 9 F F F | USER RAM AREA |
| A 0 0 0 F F F F | ROM AREA |

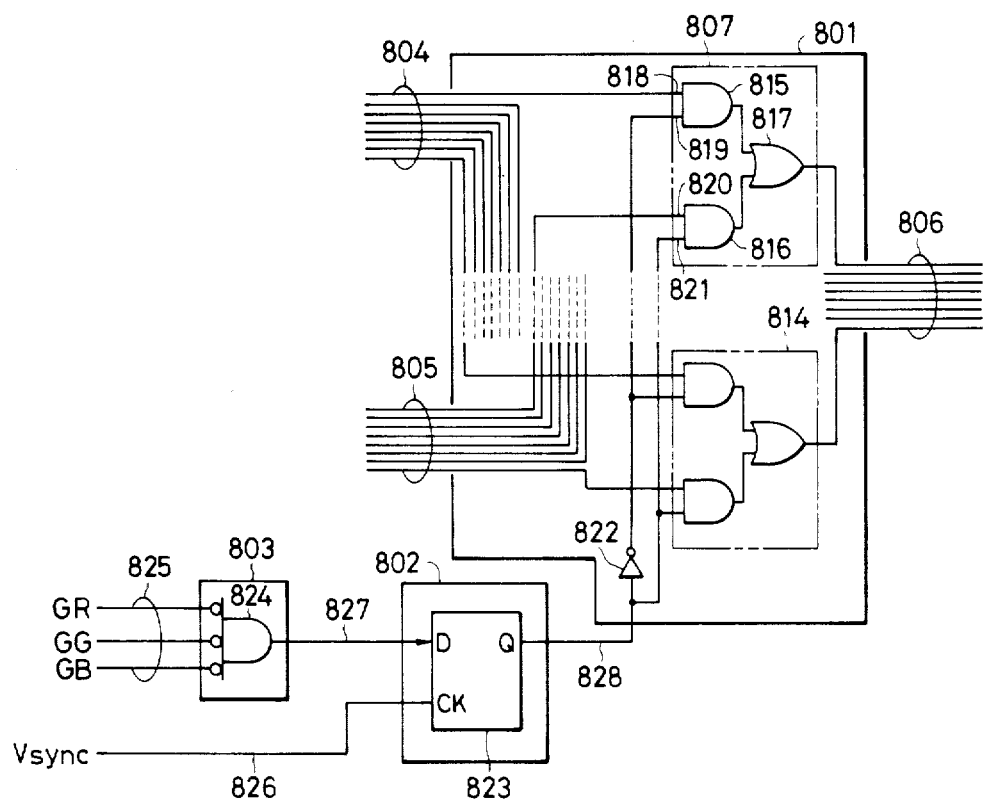

COMPUTER MEMORY REFRESH CIRCUIT

BACKGROUND OF THE INVENTION

The present invention relates to a memory refresh circuit for refreshing a computer memory and more particularly to a memory refresh circuit which is adapted to be used in a processing system for storing information employed for arithmetic processing, such as program information, data employed for arithmetic operation, data resulting from arithmetic operations as well as data displayed on the screen of a display unit, in the same (common) memory.

With the advance of semiconductor technology, personal computers have become popular. Such computers contain built-in microprocessors and are suitable for personal use.

FIG. 1 is the typical structure of a personal computer in block diagram form.

The personal computer comprises a central processing unit (CPU) 101, a random access memory (RAM) 102 for storing the data to be processed by CPU 101, the result of arithmetic operations, etc., a read only memory (ROM) 103 for storing the processing procedure effected in CPU 101, data used only in reading, etc., a data bus 104 for transmitting the data to be processed in CPU 101, an address bus 105 for transmitting the addresses of units and memories to be accessed by CPU 101, an I/O interface circuit 108 connected to the data bus 104 and the address bus 105 for connecting input/output units such as a keyboard 106 and floppy disk drive (FDD) 107 to CPU 101, a video RAM (VRAM) 111 connected to the address bus 105 through a changeover switch 112 and storing graphic information to be output on a display 110, a display address signal generator 113 connected to VRAM 111 through the changeover switch 112 and generating the display addresses for sequentially reading the graphic information stored in VRAM 111, a display control circuit 115 connected to VRAM 111 through a data bus 114 and converting the graphic information sequentially read out of VRAM 111 to an image signal to be output on the display 110, a memory control circuit 116 for selectively connecting the changeover switch 112 to the address bus 105 when writing graphic information into VRAM 111 or to the display address signal generator 113 when making a display on the display 110, a data bus control circuit 117 for connecting data bus 104 to VRAM 111 when the memory control circuit 116 writes graphic information into VRAM 111, etc. In a personal computer of this type, data employed for arithmetic operation, programs prepared by users, etc. are stored in RAM 102, while the picture information employed for display is stored in VRAM 111. Accordingly, it requires two systems of random access memories, thereby increasing the cost.

For this reason, there has been proposed a method to integrate both VRAM 111 and RAM 102 into a common memory. The typical method is described in Japanese Patent Laid-Open No. 66022/1980. There will now be explained the prior art in which the random access memory (RAM) 102 and the video random access memory (VRAM) 111 are both constituted in a common single memory, with reference to FIGS. 2-4.

The circuits shown in FIG. 2 comprise a central processing unit (CPU) 201, a display address signal generator 202 for generating display addresses necessary for display and various timing signals, a changeover switch 203 for switching over from the display addresses to the addresses from CPU or vice versa, a memory control circuit 204, a common memory 205 serving as both a system memory and a display memory, a data bus control circuit 206, a display control circuit 207, a display 208 typically formed of a cathode-ray tube, a data bus 209 for transmitting data between CPU 201 and the respective circuits, an address bus 210 for supplying an address signal, to be accessed by CPU 201, to the respective circuits, an address line 211 for sending the display addresses to indicate relative positions on the display screen, a signal line 212 for sending a signal indicating the display time, a signal line 213 for sending various synchronizing signals to the display, i.e., horizontal synchronizing signal, vertical synchronizing signal, etc., a signal line 214 for sending a switching signal to switch over the changeover switch 203 from the addresses from transmitting CPU 201 to transmitting the display addresses or vice versa, a signal line 215 for sending a control signal applied to the data bus control circuit 206, a signal line 216 for sending a control signal applied to the memory 205, a changeover switch 217 for connecting the memory 205 to the display control circuit 207 only when display data is read out of the memory 205, a signal line 218 for supplying a switching signal to the changeover switch 217.

FIG. 3 is an example of allocation of the common memory 205. Addresses are expressed in hexadecimal notation.

The region of addresses 0000-0500 is a work memory area which is used by CPU at the time of calculation. The region of addresses 0501-43FF is a display memory area for storing therein display data. In other words, this memory area is used for the same purpose as the video random access memory (VRAM) in the circuitry of FIG. 1. The region of addresses 4401-9FFF is a user RAM area which can be employed freely by users and in which various data, programs prepared by users, etc. are stored. The region of addresses A000-FFFF is a ROM area which functions similarly to a read only memory (ROM). This area stores therein a compiler program, an interpreter program or programs and data for supervising an operating system and computer system.

It is to be noted herein that the areas other than the display memory area are together referred to as a system memory, because they are used by the computer in arithmetic processing.

FIG. 4 shows a relationship between the horizontal scanning time and the vertical scanning time in the display, when information is displayed using the circuitry of FIG. 2. As shown in FIG. 4, the total scanning time is divided into two parts; a display time 401 and a blanking time 402. During the display time 401, the display data are sequentially read out of the memory 205 and then indicated on the display 208. During the blanking time 402, the changeover switch 203 is connected to the side of the address bus 210 to stop reading of the display data from the memory 205, thereby alternately transmitting data between the central processing unit (CPU) 201 and the system memory area in the memory 205, or rewriting data for the display memory area.

Operation of the circuitry shown in FIG. 2 will now be briefly described.

First, during the display time, the address changeover switch 203 is connected to the side of the display address line 211 and display addresses are applied to the memory 205 from the display address signal generator 202.

The display addresses output from the display address signal generator 202 are those corresponding to addresses of the display memory area in the memory 205 shown in FIG. 3, and these addresses correspond to positions on the screen of the display 208 in a one-to-one relation. In accordance with scanning of the display 208, the display addresses are sequentially supplied from the display address signal generator 202 to the memory 205, and display data, brightness, color, etc., corresponding to positions on the display screen are read out of the memory 205 to be supplied to the display control circuit 207. The display control circuit 207 generates an image signal indicating characters or figures corresponding to the display data supplied from the memory 205, and then supplies the image data to the display 208.

Coming into the blanking time, the address changeover switch 203 is connected to the side of the CPU address line 210 and an address signal from the CPU is applied to the memory 205. At this time, the data bus control, circuit 206 conducts and connects the data bus 209 to the memory 205, so that CPU 201 transmits and receives data to and from the memory 205 through the data bus 209.

This system is advantageous in that the circuit structure is relatively small, and also in that a dynamic RAM, much cheaper than a static RAM, can be used as the memory 205 without the need for providing a refresh circuit. Because a dynamic RAM stores information by utilizing a floating capacity in its internal gate, it tends to lose the content stored therein, if left as it is, from the fact that the electric charge accumulated in the gate is gradually reduced by leakage current through floating capacitance. To prevent the above tendency, the dynamic RAM generally requires a refresh circuit which periodically charges the gate capacity, the so-called "refresh" operation. In the above system, however, since the memory 205 is sequentially read for display in the display time, and since the refresh operation is performed simultaneously at that time, there is no need for providing a special refresh circuit.

But in such a system, data transmission between CPU 201 and the memory 205 is allowed only during blanking time, with a consequent low processing speed when the programs on the system memory are operated, or when the displayed content is changed.

For example, assuming that the display time and the blanking time are each given as 50% in FIG. 2, the average processing speed would be reduced by half. And if a dynamic random access memory DRAM is used as the memory 205, display reading must be made from the dynamic RAM to run the refresh operation for DRAM even in case of technical calculation, for example, which requires no display. Thus, processing speed is lowered independently of the presence or absence of display in the above-mentioned system, because data transmission between CPU 201 and memory 205 is not allowed during the display time.

SUMMARY OF THE INVENTION

It is an object of the present invention to provide a memory refresh circuit suitably used in a computer which has a dynamic random access memory including a system memory area employed for arithmetic processing in a central processing unit and a display memory area employed for output on a display, and more particularly to provide a memory refresh circuit which is capable of preventing a reduction in a processing speed otherwise caused by memory refresh.

According to the present invention, therefore, a display address signal generator for generating a display address signal and a refresh counter for generating a refresh address signal are both connected to an address signal input terminal of a dynamic random access memory through a changeover switch. A display signal detection circuit is provided which decides whether or not information stored in the dynamic random access memory is output on a display, so that when the display signal detection circuit detects that information is displayed, the changeover switch is activated to apply the display address signal from the display address signal generator to the address signal input terminal of the dynamic random access memory. When the display signal detection circuit detects that information is not being displayed, the changeover switch is activated to apply the refresh address signal from the refresh counter to the address signal input terminal of the dynamic random access memory for a predetermined time within a given time interval, for refreshing the memory.

The display signal detection circuit decides whether or not information is being displayed by detecting a display command signal from the CPU. The display signal detection circuit can also decide whether or not information is being displayed, by detecting read-out of the display data signal from VRAM. Furthermore, the display signal detection circuit can decide whether or not information is being displayed, by detecting whether or not an image signal is supplied to the display.

BRIEF DESCRIPTION OF THE DRAWINGS

FIG. 8 is a circuit diagram of a display signal detection circuit (803), switching control circuit (802) and a changeover switch (801) used in the present invention;

DETAILED DESCRIPTION OF THE INVENTION

Figure 5:
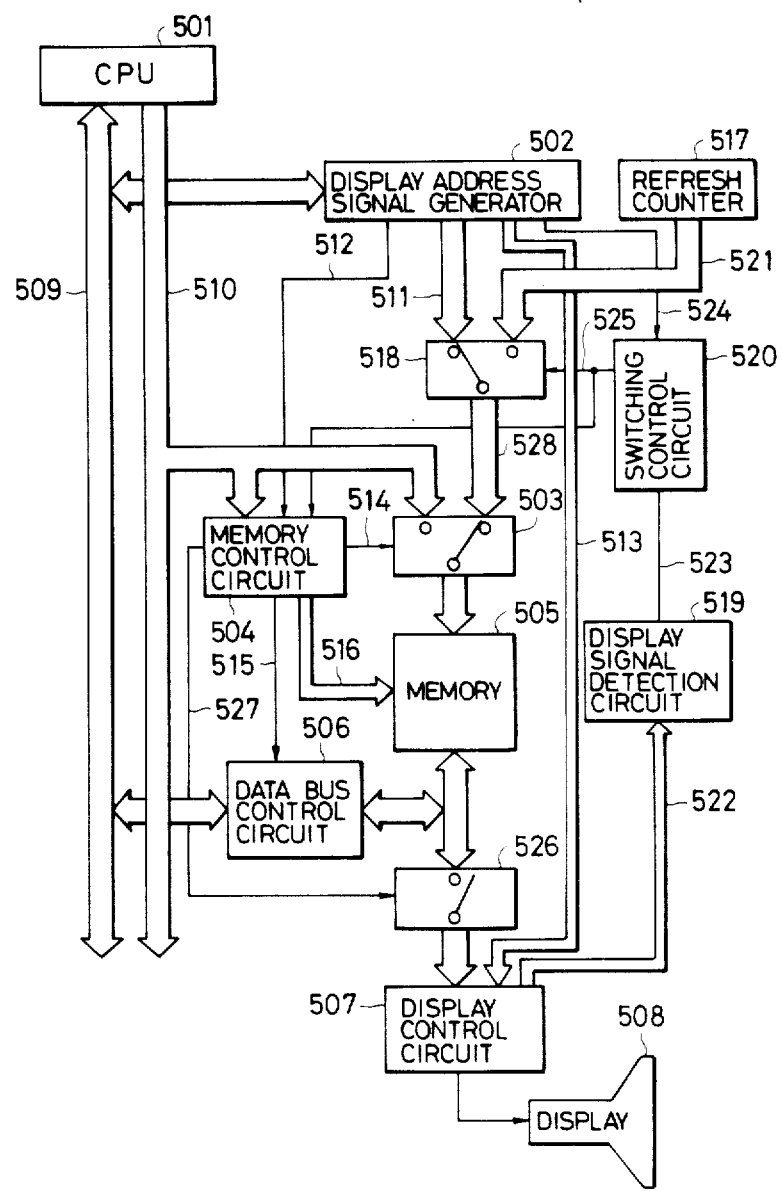
FIG. 5 is a block diagram showing a first embodiment of the present invention.

One embodiment of the present invention will now be described with reference to FIG. 5, which is a circuit block diagram depicting the first embodiment of the present invention.

A data bus 509 and an address bus 510 are connected to CPU 501. An output terminal of a display address signal generator 502 for supplying display addresses to a common memory 505 and an output terminal of a refresh counter 517 are connected to two input terminals of a changeover switch 518 through address buses 511, 521, respectively. An output terminal of the changeover switch 518 is connected to one input terminal of a changeover switch 503 through a bus 528. Connected to the other input terminal of the changeover switch 503 is the address bus 510 from CPU 501. An output terminal of the changeover switch 503 is connected to an address line of the common memory 505. Connected to the address bus 510 is a memory control circuit 504, from which a control signal is supplied to the changeover switches 503, 526 and a data bus control circuit 506 through signal lines 514, 515 and 527, respectively. The data bus 509 is connected to another terminal of the common memory 505 through the data bus control circuit 506. Connected to a data input/output terminal of the common memory 505 is a display control circuit 507 through a changeover switch 526. The display control circuit 507 is connected to the display address signal generator 502 through a signal line 513, so that various synchronizing signals such as a horizontal synchronizing signal and a vertical synchronizing signal are supplied from the display address signal generator 502 to the display control circuit 507. A display 508 is connected to the display control circuit 507, through which an image signal corresponding to the data read out of the common memory 505 is supplied to the display 508. The display control circuit 507 is connected to a display signal detection circuit 519 through a signal line 522. The image signal is supplied to the signal line 522, and the display signal detection circuit 519 decides whether or not information is to be indicated on the display 508, by detecting the presence or absence of the image signal on the signal line 522. The decision result of the display signal detection circuit 519 is supplied to a switching control circuit 520 through a signal line 523. Supplied to the switching control circuit 520 is a vertical synchronizing signal from the display address signal generator 502 through a signal line 524. An output terminal of the switching control circuit 520 is connected to the changeover switch 518 and the memory control circuit 504 through a signal line 525.

In the above, the changeover switch 518 is a switch adapted to switch from display addresses out of the display address signal generator 502 the refresh addresses out of the refresh counter 517 or vice versa in accordance with a switching signal supplied from the switching control circuit 520, thereby causing either one thereof to be output to one input terminal of the changeover switch 503.

Operation of the system shown in FIG. 5 will be described hereinafter.

First, there will be described functions of the display signal detection circuit 519 and the switching control circuit 520.

The display signal detection circuit 519 decides that information is displayed, when the image signal is detected on the signal line 522, and decides that information is not displayed, when the image signal is not detected on the signal line 522.

Decision in the display signal detection circuit 519 is made separately and singly for each field period in synchronous relation with the vertical synchronizing signal. Thus, the presence or absence of information display is detected once within a period of a single field.

When a display detection signal sent from the display signal detection circuit 519 through the signal line 523 indicates the non-displayed state at the starting time of the next field, the switching control circuit 520 functions to activate the changeover switches 518, 503 and 526 so that burst mode refresh will be made using the refresh counter 517 as will be described later. More specifically, the changeover switch 518 connects the address line 521 from the refresh counter 517 to the output bus 528 of the changeover switch 518 for a period of 64 µs for each 2 ms. Simultaneously, an output signal from the switching control circuit 520 is supplied to the memory control circuit 504 through the signal line 525.

The memory control circuit 504 controls the changeover switch 503 so that the bus 528 is connected to the address line of the common memory 505. The memory control circuit 504 also turns off the switch 526. The common memory 505 is refreshed with an address signal supplied from the refresh counter 517.

Burst mode refresh will now be described.

Figure 6:
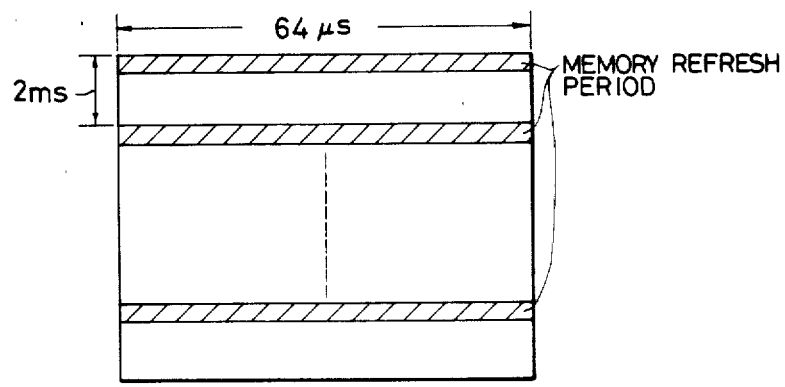
FIG. 6 is a view for explaining burst mode refresh.

The burst mode refresh is carried out in such a manner that access from the CPU to the dynamic random access memory DRAM is inhibited once within a given period of time, and during this time a refresh address signal is fed from the refresh counter to the address lines of DRAM in order, thereby refreshing the memory. FIG. 6 is the memory refresh in the screen formation when information is not displayed. Herein, there is shown the so-called burst mode refresh in which, supposing that the refresh cycle of the dynamic RAM is 128 times/2 ms, memory access from CPU is temporarily stopped for each 2 ms and memory refresh is performed 128 times. In such burst mode refresh, if it is assumed that a single memory refresh takes 500 ns, for example, the time required for refreshing memory 128 times is given as follows;

$$500 \text{ ns} \times 128 = 64 \text{ µs}$$

This is only 3.2% of 2 ms:

$$64 \text{ µs}/2 \text{ ms} = 0.032$$

Thus, memory refresh causes a 3.2% reduction in processing speed of CPU.

This means that the memory access inhibition time of CPU 501 is reduced in the ratio of 3.2/50 as compared with memory refresh using the conventional display reading, and that the computing speed of CPU is increased correspondingly.

In this embodiment, switching control circuit 520 is synchronized with the vertical synchronizing signal. If the embodiment were not so constructed, the memory refresh would occur during the switchover from the display address signal generator 502 to the refresh counter 517 while information was being displayed, thereby breaking continuity between refresh addresses thereby impairing the refresh operation.

However, it is not always necessary to the memory in synchronism with the vertical synchronizing signal. Such a control circuit operated in synchronism with the vertical synchronizing signal can be dispensed with, if refresh and display are alternately switched depending on the presence or absence of display using software.

In this case, CPU 501 directly controls both the changeover switch 518 and the memory control circuit 504 so as to effect burst mode refresh.

The second embodiment of the present invention will be described below.

Figure 7:
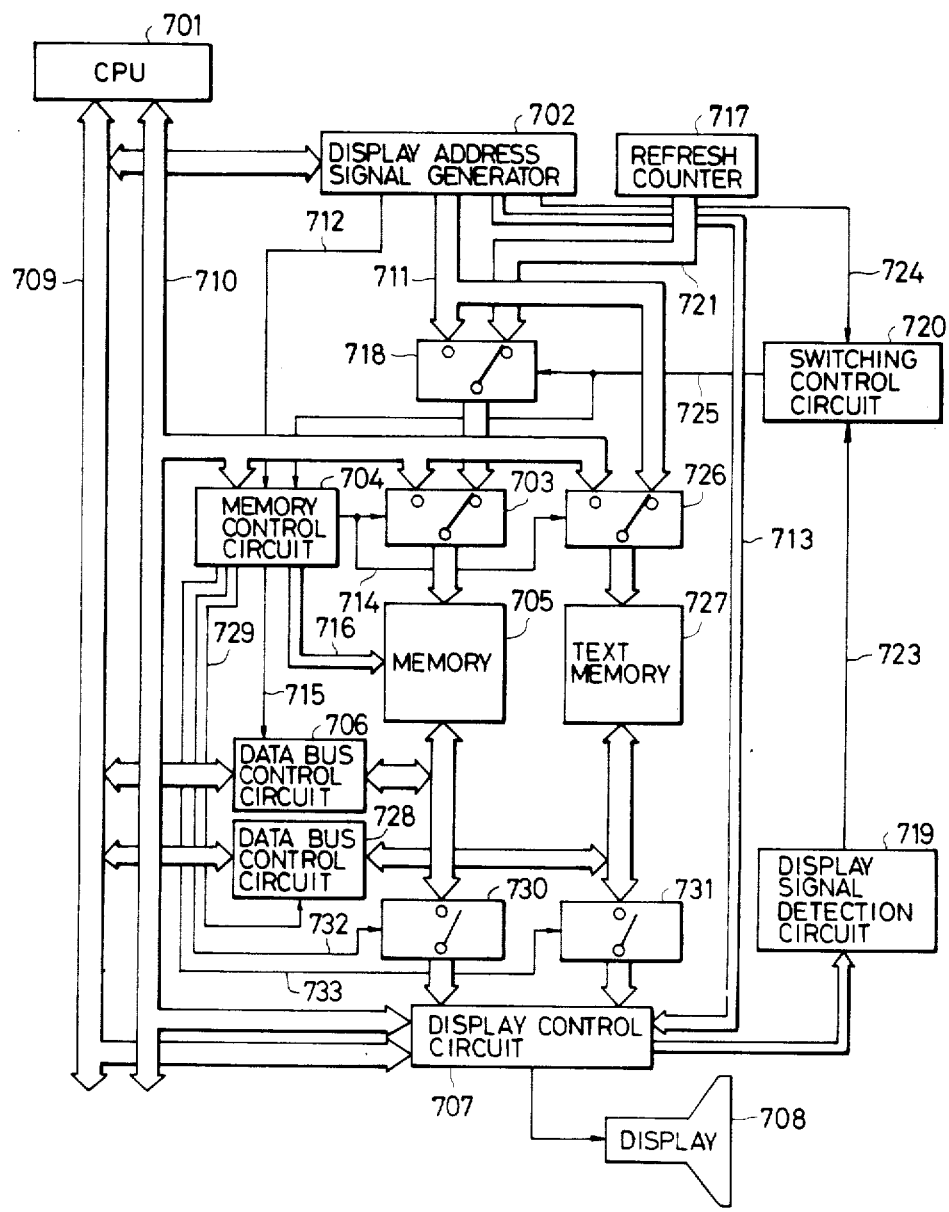
FIG. 7 is a block diagram showing a second embodiment of the present invention.

FIG. 7 is a block diagram of the embodiment.

A data bus 709 and an address bus 710 are connected to CPU 701. This system includes a text memory 727 for displaying characters and a common memory 705 which serves as both a system memory and a graphic memory for displaying figures. The address bus 710 is connected to an address input terminal of the common memory 705 through a changeover switch 703, and also to an address input terminal of the text memory 727 through a changeover switch 726. Connected to one input terminal of the changeover switch 703 are a display address signal generator 702 and a refresh counter 717 through a changeover switch 718, while connected to one input terminal of the changeover switch 726 is the display address signal generator 702 through an address bus 711.

A data input/output terminal of the common memory 705 is connected to a data bus control circuit 706 and a switch 730. The other terminal of the switch 730 is connected to a display control circuit 707. An input/output terminal of the text memory 727 is connected to a data bus control circuit 728 and a switch 731. The other terminal of the switch 731 is connected to the display control circuit 707.

Connected to the address bus 710 is a memory control circuit 704, from which a control signal is supplied to the changeover switches 703, 726, data bus control circuits 706, 728 and the switches 730, 731 through signal lines 714, 715, 729, 732 and 733.

When data is written into the common memory 705 and the text memory 727, the switches 730 and 731 are turned off, respectively, thereby preventing the written data from entering the display control circuit 707.

To produce a color indication on the screen of a display 708 in a matrix of 80 characters×25 lines, a memory with 2K bytes for the character code and 2K bytes for character color is required as the text memory 727, which is therefore normally formed of a static RAM of 4K bytes. Assuming now that the screen of the display 708 consists of picture elements of 640×200 dots, the graphic memory in the common memory 705 requires a capacity of 16K bytes for each of three primary colors R, G and B. In general, the common memory 705 is formed of a memory of 64K bytes comprising eight dynamic RAM's each having 64K bits. Out of the total 64K bytes, an area of 48K bytes is used as the graphic memory area and the remaining area of 16K bytes is used as the system memory area.

Operation of the system shown in FIG. 7 will be described hereinafter.

There will be described the case in which the CPU makes arithmetic operation or write data into the memory.

CPU 701 sends a control signal to the memory control circuit 704 through the address bus 710, switches the changeover switch 703 or 726 to the side of the data bus 710, conducts the data bus control circuit 706 or 728, and turns off the switch 730 or 731. In this way, both the address bus 710 and the data bus 709 are connected to the common memory 705 or the text memory 727 to permit memory access through both buses, thereby effecting arithmetic operation using the system memory area in the common memory as well as writing the display data into the graphic memory area in the common memory or the text memory.

There will now be described an operation for indicating characters or figures on the display 708.

When indicating information on the display 708, the switch 730 or 731 conducts and the data input/output terminal of the common memory or text memory is connected to the input terminal of the display control circuit 707. Further, the changeover switches 703 and 718 or the changeover switch 726 is controlled so that the display address output terminal of the display address signal generator 702 is connected to the address input terminal of the common memory 705 or text memory 727 through the address bus 711. A display command signal is sent from CPU 701 to the display control circuit 707 through both buses 709 and 710.

When indicating only characters on the display 708, address signals corresponding to display positions on the screen of the display 708 are sequentially output from the display address signal generator 702 to the text memory 727, and character data are sequentially read out of the text memory 727 and then supplied to the display control circuit 707, which in turn generates image signals corresponding to the character data and then supplies them to the display 708. As a result, images corresponding to the image signals are indicated on the display 708.

Similarly, when displaying only figures, display address signals for the display memory area are supplied from the display address signal generator 702 to the common memory 705, and display data corresponding to the display address signals are sequentially read out of the common memory 705 and then supplied to the display control circuit 707, which in turn generates image signals corresponding to the display data and then supplies them to the display 708, thus indicating information on the display 708.

When displaying both characters and figures simultaneously, display address signals are supplied from the display address signal generator 702 to the common memory and text memory, and figure display data and character data are respectively read out of the common memory and text memory and then supplied to the display control circuit 707, which in turn combines the figure display data and character display data to generate image signals for driving the display 708 and then supplies those signals to the display 708. Based on the image signals, characters and figures are both indicated on the display 708.

There will now be described memory refresh for the common memory 705 and text memory 727.

Since the text memory 727 is usually formed of a static RAM, it requires no memory refresh. If a dynamic RAM is used, memory refresh is performed with the address signal from the display address signal generator 702 as in the prior art, because the text memory 727 is employed for the purpose of display only and has no effect on the computing speed of CPU 701.

The common memory 705 is refreshed in a fashion of burst mode refresh using the refresh counter 717 as in the above embodiment.

More specifically, the display signal detection circuit 719 detects the display signal for each of colors R, G and B supplied from the display control circuit 707 to decide the presence or absence of display, i.e., whether or not the common memory 705 is being employed for display of information, in accordance with the display command signal supplied from CPU 701 to the display control circuit 707, and then supplied to the switching control circuit 720 a signal indicating the presence of figure display. When the display detection circuit 719 detects no signal indicating the presence of figure display at the starting time of the next field, the switching control circuit 720 decides that figure display is not being performed, and controls the changeover switch 718 to connect the output side of the refresh counter 717 to the input of the changeover switch 703. The memory control circuit switches over the changeover switch 703 for a period of 64 is for each 2 ms to supply the output of the refresh counter 717, i.e., refresh address signal, to the common memory 705, thereby making a burst mode refresh.

According to this embodiment, since character data for character display is stored in the text memory independently of the system memory (i.e., system memory area in the common memory), in case of no figure display using the figure display area in the common memory, the processing speed of CPU 701 can be improved while making character display on the display 708, by subjecting the text memory 727 to refresh memory with the display address signal from the display address signal generator 702 and, at the same time, subjecting the system memory 705 to burst mode refresh.

Since graphic display is not required in many cases when using computers for scientific and technological calculations, the effect of improving the processing speed resulted from the present invention is sufficiently attractive when computers are employed for such purpose.

Hereinafter, specific embodiments of the switching control circuit 720, changeover switch 718 and the display signal detection circuit 719 shown in FIG. 7 will be described with reference to FIG. 8.

In FIG. 8, a changeover switch 801 is a specific embodiment of the changeover switch 718 in FIG. 7, a switching control circuit 802 is a specific embodiment of the switching control circuit 720 in FIG. 7, and a display signal detection circuit 803 is a specific embodiment of the display signal detection circuit 719 in FIG. 7.

A bus line 804, corresponding to the bus line 711 in FIG. 7, from the display address signal generator 702 and a bus line 805, corresponding to the bus line 721 in FIG. 7, are connected to the changeover switch 801, an output bus line 806 of which is connected to one input terminal of the changeover switch 703. Each of those bus lines comprises of eight signal lines for transmitting an 8-bit signal.

The changeover switch 801 comprises the eight switches, 807-814. Note that the second through seventh switches, 808-813, each have the same structure as the first and eighth switches 807, 814, and are not shown in FIG. 8. The first switch 807 consists of a first AND circuit 815, a second AND circuit 816 and an OR circuit 817. Connected to one input terminal 818 of the first AND circuit 815 is the first signal of the bus line 804. Connected to the other input terminal 819 of the first AND circuit 815 is an output terminal of the switching control circuit 802 through a NOT circuit 822. One input terminal 820 of the second AND circuit 816 is connected to the first signal line of the bus line 805, while the other input terminal 821 thereof is connected to the output terminal of the switching control circuit 802. Output terminals of the first and second AND circuits 815, 816 are connected to input terminals of the OR circuit 817, an output terminal of which in turn is connected to the first line of the output bus line 806.

Likewise, as to the subsequent switch n, the signal line n of the bus line 804 is connected to one input terminal of its first AND circuit, and the signal line n of the bus line 805 is connected to one input terminal of its second AND circuit. The other input terminal of the first AND circuit is connected to the output terminal of the switching control circuit 802 through the NOT circuit 822, and the other input terminal of the second AND circuit is directly connected to the output terminal of the switching control circuit 802.

The switching control circuit 802 is formed of a D-type flip flop 823. The display signal detection circuit 803 is formed of a 3-input NOR gate 824. Connected to three input terminals of the 3-input NOR gate 824 constituting the display signal detection circuit 803 are signal lines GR, GG and GB from the display control circuit 707, respectively. An output terminal of the NOR gate 824 is connected to a D input terminal of the D-type flip flop 823. Supplied to a clock input terminal CK of the D-type flip flop 823 is a negative vertical synchronizing signal from the display address signal generator 702 through a signal line 826.

The signals GR, GG and GB on signal lines 825 are signals which are supplied from the display control circuit 707 in FIG. 7, and which indicate whether or not a red image is displayed on the figure display screen, whether or not a green image is displayed thereon, and whether or not a blue image is displayed thereon, respectively. The case where all three signals are off (corresponding to a low level L herein), indicates that no figure is displayed on the screen of the display 708.

As to the operation of the changeover switch 801, when the output of the switching control circuit 802 assumes a high level H, the second AND circuit is turned on, or enabled and the first AND circuit is turned off, or disabled, so that the output of the bus line 805 is transmitted to the bus line 806. Conversely, when the output of the switching control circuit 802 assumes a low level L, the first AND circuit is turned on, or enabled, and the second AND circuit is turned off, or disabled, so that the output of the bus line 804 is transmitted to the bus line 806.

Figure 9:
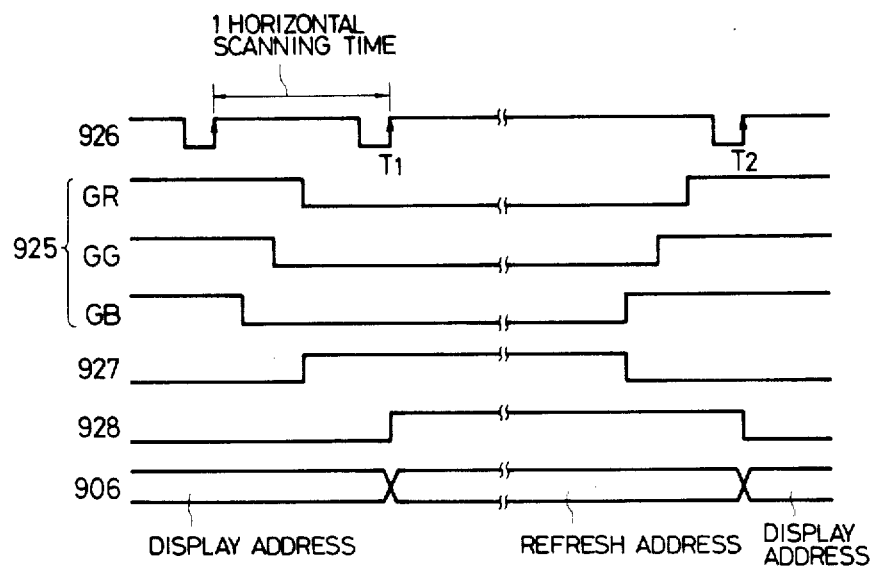
FIG. 9 is a waveform chart showing operation of the circuit shown in FIG. 8.

FIG. 9 illustrates the operational waveforms for this circuit.

A waveform 926 represents a vertical synchronizing signal sent to the signal line 826. Waveforms 925 show the signals GR, GG and GB which are sent to the signal lines 825 and indicate the presence or absence of display of three colors RED, GREEN and BLUE. When the signals GR, GG and GB indicating the presence or absence of color display assume all a low level L, the output of the display signal detection circuit 803 (719) becomes a high level H as shown by a waveform 927. The switching control circuit 802 samples the output signal 927 of the display signal detection circuit 803 at an arrival time T1 of the next vertical synchronizing signal, and then outputs a signal as shown by a waveform 928. In accordance with the output signal 928 from the switching control circuit 802, the changeover switch 801 switches over from the display address signal from the bus line 804 to the refresh address signal from the bus line 805 to be output to the bus line 806, as shown by a waveform 906 in FIG. 9. In other words, during the period from T1 to T2, because the output signal 928 of the switching control circuit, assumes a high level H, the changeover switch 801 causes the second AND circuit to turn on, so that the refresh address signal on the bus line 805 is output to the bus line 806.

At a time T2, corresponding to the beginning of the next vertical synchronizing signal, the signals GR, GG and GB assume now a high level, so the switching control circuit 802 samples the output signal 927 of the 3-input NOR circuit, i.e., display signal detection circuit 803, and then outputs a signal of low level L. Accordingly, the first AND circuit of the changeover switch 801 is turned on, thereby issuing the output on the bus line 804 to the bus line 806, i.e., transmitting the display address signal to the bus line 806.

In this embodiment, as mentioned above, either display addresses or refresh addresses are transmitted to the common memory 705 through the bus line 806 in accordance with the presence or absence of figure display, thus making it possible to perform burst mode refresh when no figure is being displayed.

The embodiment of FIG. 7 can provide not only the advantage that the reduction in processing speed caused by refresh operation is reduced in the case of scientific and the technological calculations, for example, which require only character display, but also the advantage that, even in case of rewriting graphics, this is achieved with a higher speed than the prior art by temporarily stopping graphics display, switching to character display, rewriting the graphic memory during this period and then resuming graphic display after completion of rewriting.

Figure 10:
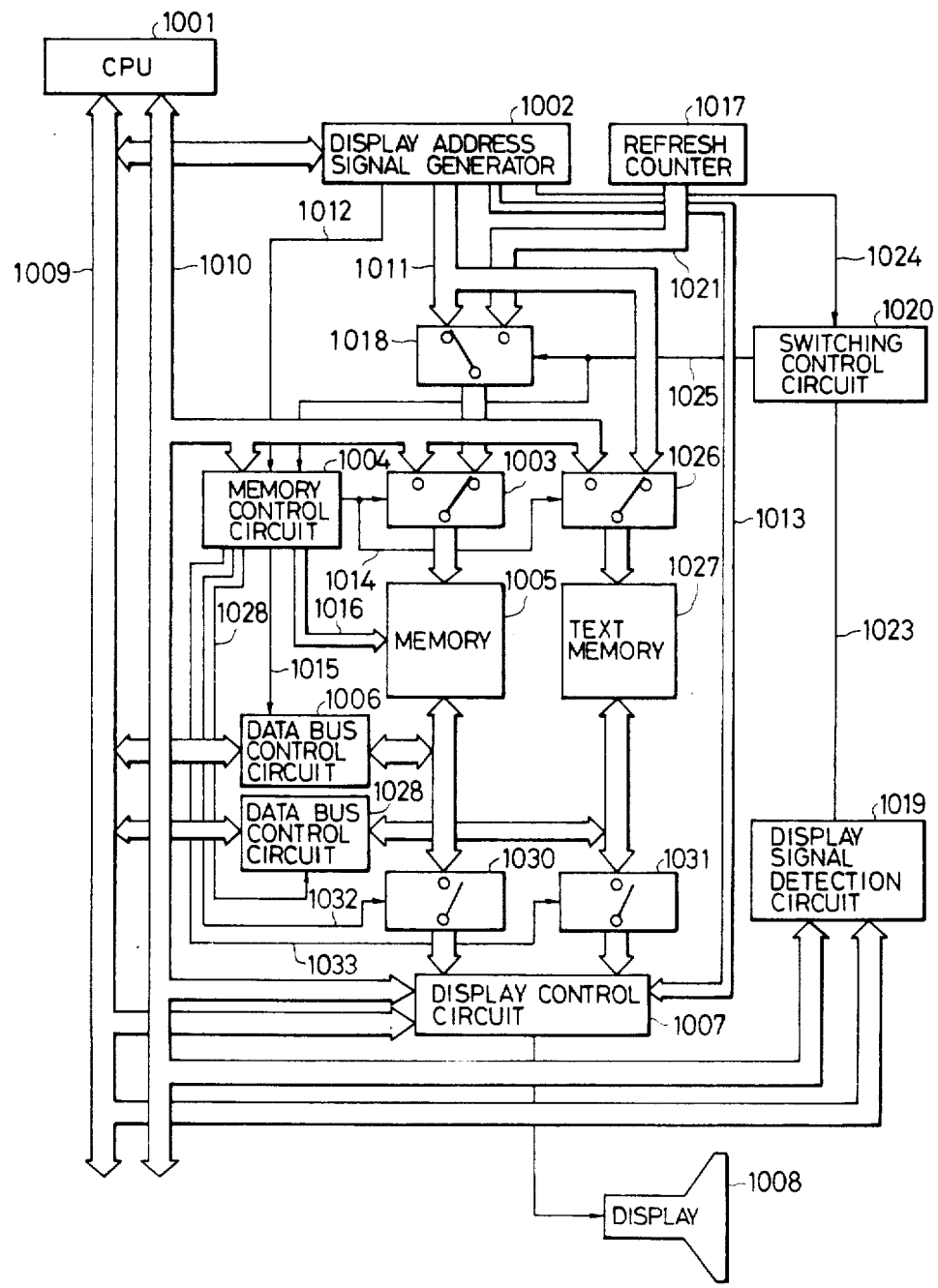
FIG. 10 is a view showing a third embodiment of the present invention.

FIG. 10 shows a modified version of this embodiment. Those constitutional components designated by reference numerals between 700 and 800 in FIG. 7 are herein designated by reference numerals between 1000 and 1100 in FIG. 10, and those numerals having the same two as the final digits denote identical components.

In the structure of FIG. 10, a display signal detection circuit 1019 is directly connected to both a data bus 1009 and an address bus 1010. The display signal detection circuit 1019 detects a display command signal sent from CPU 1001 to a memory control circuit 1004 through both buses, and then decides whether or not information is to be displayed or not. The result of this decision is output to a switching control circuit 1020.

Thus, the circuitry of FIG. 10 operates in the same manner as that of FIG. 7, except that they are different only in the method of detecting whether . or not information is to be displayed.

Although the case of integrating the entire graphic memory and the system memory into a common memory was explained with reference to the embodiments of FIGS. 7 and 10, it is a matter of course that the present invention is also applicable in the case of integrating a part of the graphic memory and the system memory into a common memory.

Figure 1:
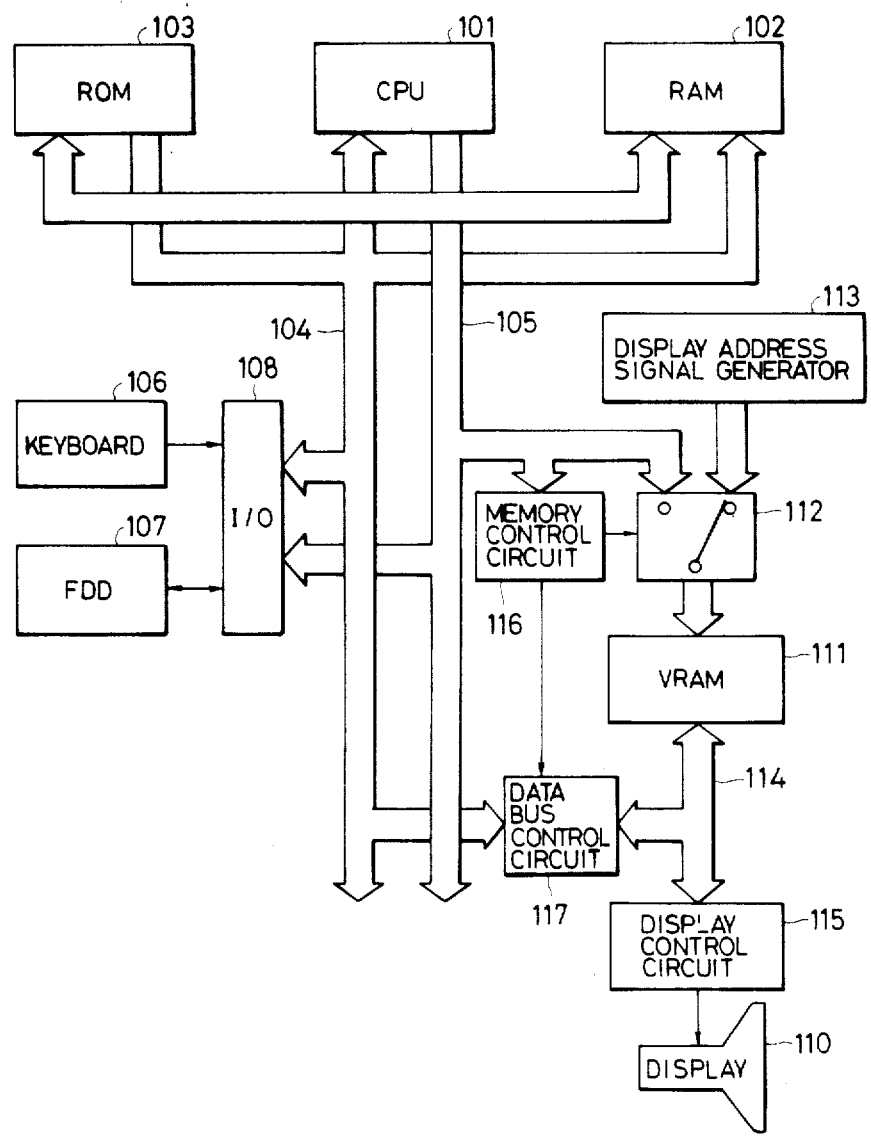
FIG. 1 is a block diagram showing the typical structure of a personal computer.
Figure 2:
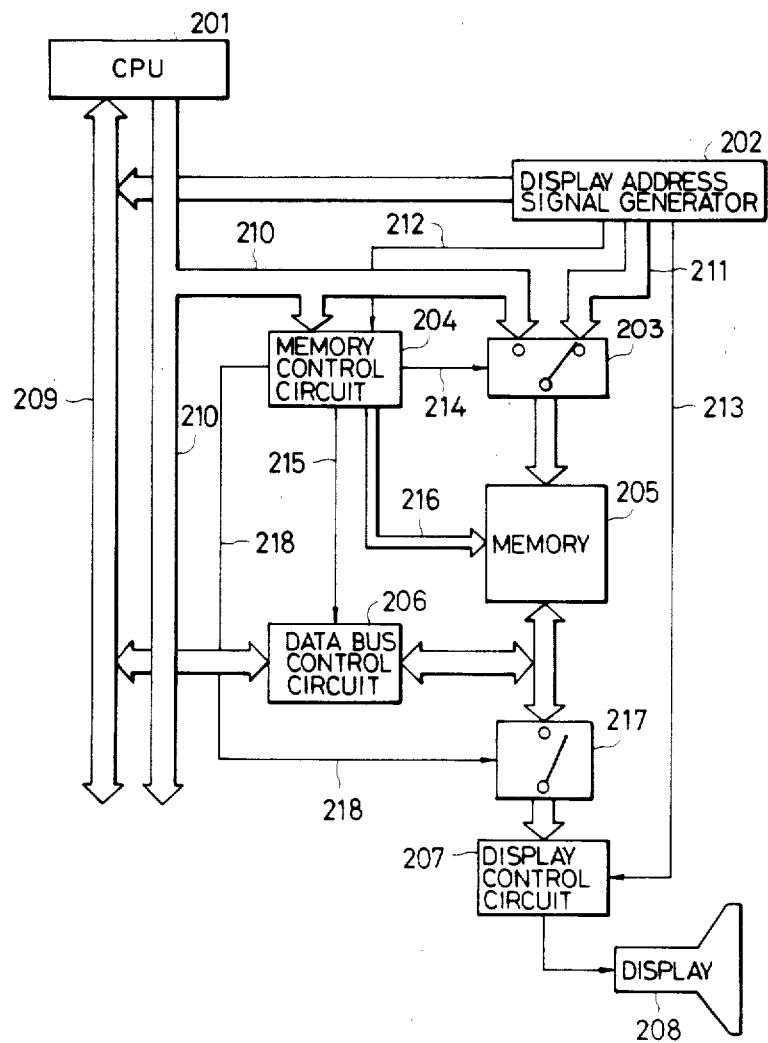
FIG. 2 is a block diagram showing the structure of a conventional memory refresh circuit.
Figures 3, 4:
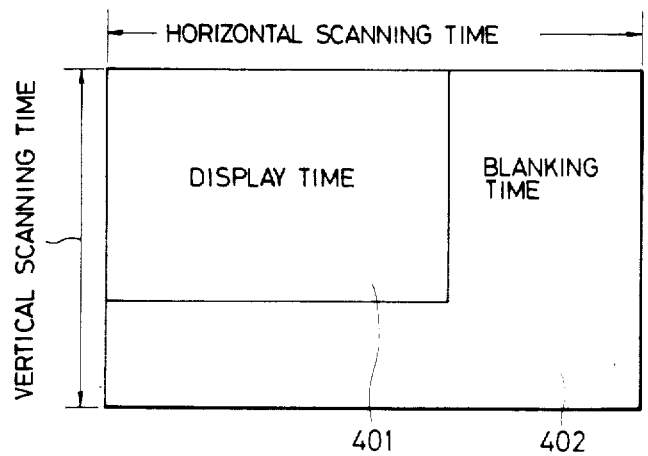
FIG. 3 is a memory map for explaining memory areas of a common memory.
FIG. 4 is a view showing the relationship between scanning time and display time in a display.

Although in the above description, as shown in FIG. 4, data transmission between CPU and the common memory was made only during blanking time and memory refresh was performed during display time by the use of reading for display, the present invention is also effective in cases where a blank time is introduced in the display time for each particular number of display character cycles, and data transmission between CPU and the common memory is made during such a blank time.

Further, although in the foregoing embodiments burst mode refresh was adopted as a refresh method to be effected during the time when display reading is not utilized, it is possible to adopt other refresh methods such as dispersed refresh in which refresh operation is performed once for each given period of time.

In addition, although in the foregoing embodiments timing adjustment was carried out in the switching control circuit with a vertical synchronizing signal to switch refresh methods in units of vertical scanning time, it is not necessarily required to adjust timing with the vertical synchronizing signal and to change refresh methods in units of vertical scanning time.

In recent years, since a dynamic RAM with a built-in refresh counter has been developed, there is no need of providing an external refresh counter if such a new DRAM is employed.

The essential idea in the present invention is that, in a memory control circuit for a computer system or the like including a dynamic memory which is commonly used as a part or whole of a display memory and a system memory, the methods of refreshing the common memory are changed in accordance with whether or not the display data in the common memory is to be displayed.

According to the present invention, the processing capacity of the CPU can be improved as compared with the prior art in a computer system including a dynamic memory which is commonly used as a display memory and a system memory.

What is claimed is:

1. In a computer including a central processing unit, display means for displaying display data, and memory means having a plurality of addressable storage locations forming a first memory area used for data processing effected in said central processing unit and a second memory area for storing display data to be displayed on said display means, the improvement comprising:
   changeover switch means having first, second and third input terminals and an output terminal, the latter connected to an address input terminal of said memory means;
   display address signal generating means for generating display address signals corresponding to storage locations of said second memory area of said memory means and for outputting said address signals to said first input terminal of said changeover switch means;
   refresh address signal generating means for generating refresh address signals corresponding to storage locations of said second memory area of said memory means and for outputting said refresh address signals to said second input terminal of said changeover switch means;
   an address bus, connected to said central processing unit, and being operatively connected to said third input terminal of said changeover switch means, for supplying address signals corresponding to storage locations of said first memory area of said memory means;
   display signal detecting means for detecting display data read out of the second memory area of said memory means; and
   switching control means for controlling said changeover switch means so that:
   (a) the address signal input terminal of said memory means is connected to an output terminal of said display address signal generating means via said first input terminal of said changeover switch means when said display signal detecting means detects display data being read out of said second memory area of said memory means, and
   (b) when said display signal detecting means detects no display data being read out of said second memory area of said memory means the address signal input terminal of said memory means is connected to the output terminal of said refresh address signal generating means, via said second input terminal of said changeover switch, for a predetermined time period at predetermined intervals during a display frame time, and the address signal input terminal of said memory means is connected to said address bus, via said third input terminal of said changeover switch means, during a remaining portion of said display frame time.

2. The improvement according to claim 1, wherein said changeover switch means comprises:

first switch means connected to both said display address signal generating means and said refresh address signal generating means for selectively transmitting either display address signals from said display address signal generating means or refresh address signals from said refresh address signal generating means; and second switch means connected to both an output terminal of said first switch means and said address bus for supplying either one of the signals being transmitted from said first switch means and the address signal supplied through said address bus to the address signal input terminal of said memory means.

3. The improvement according to claim 2, wherein said changeover switch means operates such that:

when said display signal detecting means detects no display data, said second switch is controlled by said switching control means to connect said address bus to the address signal input terminal of said memory means, and both said first and second switches are controlled to connect the output terminal of said refresh address signal generating means to the address signal input terminal of said memory means for a predetermined time period at predetermined intervals.

4. The improvement according to claim 1, wherein said display signal detecting means includes means for detecting the presence or absence of reading of display data in synchronous relation with a vertical synchronizing signal for controlling said display means.

5. The improvement according to claim 1, wherein detecting of the presence or absence of display data by said display signal detecting means occurs once within a period of a single field.

6. The improvement according to claim 1, wherein said refresh address signal generating means comprises a refresh counter providing burst mode refresh during said predetermined time period.

7. In a computer including a central processing unit, display means for displaying display data, and memory means having a plurality of addressable storage locations forming a first memory area used for data processing effected in said central processing unit and a second memory area for storing display data to be displayed on said display means, the improvement comprising:

changeover switch means, having first, second and third input terminals and an output terminal the latter connected to an address input terminal of said memory means;

display address signal generating means for generating display address signals corresponding to storage locations of said second memory area of said memory means and for outputting said address signals to said first input terminal of said changeover switch means;

refresh address signal generating means for generating refresh address signals corresponding to storage locations of said second area of said memory means and for outputting said refresh address signals to said second input terminal of said changeover switch means;

an address bus, connected to said central processing unit, and being operatively connected to said third input terminal of said changeover switch means for supplying address signals corresponding to storage locations of said first memory area of said memory means and display command signals indicating whether or not data in said memory means is being displayed on the display means;

display command signal detecting means for detecting display data read out of the second memory area of said memory means in response to the presence of a display command signal at a display control means; and switching control means for controlling said changeover switch means so that:

(a) the address signal input terminal of said memory means is connected to an output terminal of said display address signal generating means via said first input terminal of said changeover switch means when said display command signal detecting means detects display data being read out of said second memory area of said memory means in response to a display command signal received at said display control means, and (b) when said display command signal detecting means detects no display data being read out of said second memory area of said memory means in response to the absence of a display command signal, the address signal input terminal of said memory means is connected to the output terminal of said refresh address signal generating means, via said second input terminal of said changeover switch means, for a predetermined time period at predetermined intervals during a display frame time, and the address signal input terminal of said memory means is connected to said address bus, via said third input terminal of said changeover switch means, during a remaining portion of said display frame time.

8. The improvement according to claim 1, wherein said memory means comprises a dynamic random access memory.

9. The improvement according to claim 7, wherein said memory means comprises a dynamic random access memory.

* * * * *